United States Patent
Yu et al.

(10) Patent No.: US 11,621,190 B2
(45) Date of Patent: Apr. 4, 2023

(54) METHOD FOR FILLING RECESSED FEATURES IN SEMICONDUCTOR DEVICES WITH A LOW-RESISTIVITY METAL

(71) Applicant: Tokyo Electron Limited, Tokyo (JP)

(72) Inventors: Kai-Hung Yu, Albany, NY (US); David O'Meara, Albany, NY (US); Nicholas Joy, Albany, NY (US); Gyanaranjan Pattanaik, Albany, NY (US); Robert Clark, Fremont, CA (US); Kandabara Tapily, Albany, NY (US); Takahiro Hakamata, Albany, NY (US); Cory Wajda, Albany, NY (US); Gerrit Leusink, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 43 days.

(21) Appl. No.: 17/334,389

(22) Filed: May 28, 2021

(65) Prior Publication Data

US 2021/0287936 A1     Sep. 16, 2021

Related U.S. Application Data

(62) Division of application No. 16/598,772, filed on Oct. 10, 2019, now Pat. No. 11,024,535.

(51) Int. Cl.
*H01L 21/768* (2006.01)
*H01L 21/02* (2006.01)

(52) U.S. Cl.
CPC .. *H01L 21/76879* (2013.01); *H01L 21/02211* (2013.01); *H01L 21/02636* (2013.01);
(Continued)

(58) Field of Classification Search
CPC ......... H01L 21/76844; H01L 21/76868; H01L 21/76879; H01L 21/76888;
(Continued)

(56) References Cited

U.S. PATENT DOCUMENTS

| 5,723,358 A | 3/1998 | Manley |
| 6,492,263 B1 | 12/2002 | Peng et al. |

(Continued)

FOREIGN PATENT DOCUMENTS

| KR | 10-1168768 B1 | 3/2005 |
| KR | 10-2008-0001254 A | 1/2008 |
| KR | 10-2014-0009354 A | 1/2014 |

OTHER PUBLICATIONS

Korean Intellectual Property Office, International Search Report and Written Opinion for international application No. PCT/US2019/055676, dated Feb. 5, 2020, 17 pages.

*Primary Examiner* — Eduardo A Rodela

(57) ABSTRACT

A method for filling recessed features with a low-resistivity metal. The method includes providing a patterned substrate containing a recessed feature formed in a first layer and a second layer that is exposed in the recessed feature, and pre-treating the substrate with a surface modifier that increases metal deposition selectivity on the second layer relative to on the first layer, depositing a metal layer on the substrate by vapor phase deposition, where the metal layer is preferentially deposited on the second layer in the recessed feature, and removing metal nuclei deposited on the first layer, including on a field area and on sidewalls of the first layer in the recessed feature, to selectively form the metal layer on the second layer in the recessed feature. The steps of pre-treating, depositing and removing may be repeated at least once to increase a thickness of the metal layer in the recessed feature.

20 Claims, 11 Drawing Sheets

(52) U.S. Cl.
CPC .. *H01L 21/02639* (2013.01); *H01L 21/02656* (2013.01); *H01L 21/02658* (2013.01); *H01L 21/76826* (2013.01); *H01L 21/76831* (2013.01); *H01L 21/76844* (2013.01); *H01L 21/76868* (2013.01); *H01L 21/76888* (2013.01)

(58) Field of Classification Search
CPC ......... H01L 21/02656; H01L 21/02658; H01L 21/02211; H01L 21/02636; H01L 21/02639
See application file for complete search history.

(56) References Cited

U.S. PATENT DOCUMENTS

| | | | |
|---|---|---|---|
| 7,550,822 B2 * | 6/2009 | Lee | H01L 21/76846 257/760 |
| 10,049,921 B2 * | 8/2018 | Draeger | H01L 21/76814 |
| 10,456,808 B2 * | 10/2019 | Haukka | C23C 18/1216 |
| 10,847,413 B2 * | 11/2020 | Khaderbad | H01L 23/528 |
| 11,024,535 B2 | 6/2021 | Yu et al. | |
| 11,319,334 B2 * | 5/2022 | Subramani | H01L 23/3128 |
| 2005/0031786 A1 | 2/2005 | Lee et al. | |
| 2008/0090409 A1 | 4/2008 | Yasuda | |
| 2009/0085211 A1 | 4/2009 | Robison et al. | |
| 2009/0305480 A1 | 12/2009 | Sasahara et al. | |
| 2012/0213941 A1 | 8/2012 | Steen et al. | |
| 2012/0302071 A1 | 11/2012 | Lee | |
| 2016/0351568 A1 | 12/2016 | Chang et al. | |
| 2019/0164817 A1 * | 5/2019 | Khaderbad | H01L 21/31116 |
| 2019/0164887 A1 | 5/2019 | Wang et al. | |

\* cited by examiner

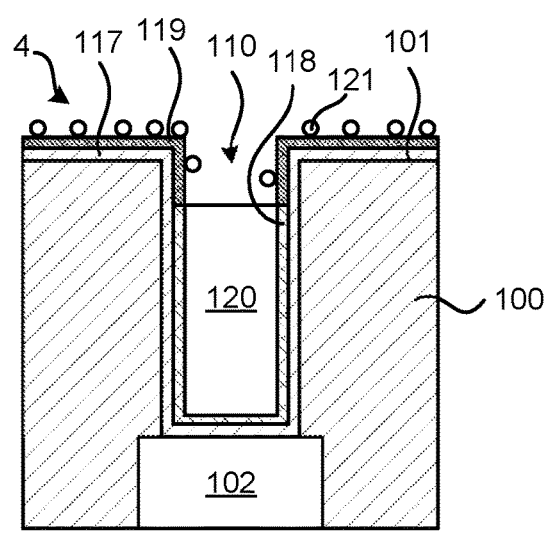 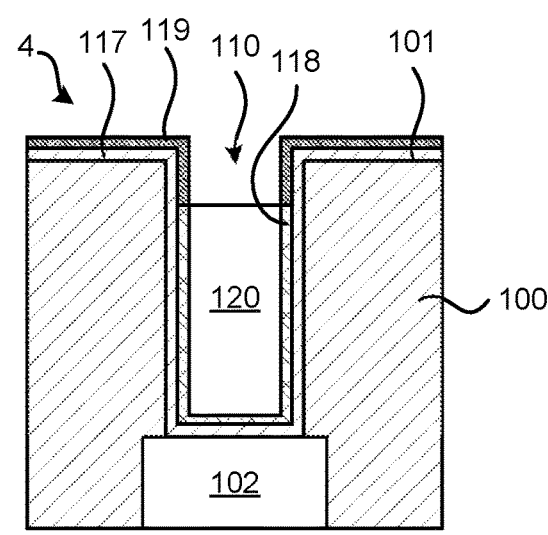
FIG. 4E                    FIG. 4F

METHOD FOR FILLING RECESSED FEATURES IN SEMICONDUCTOR DEVICES WITH A LOW-RESISTIVITY METAL

CROSS-REFERENCE TO RELATED APPLICATIONS

The present application is a Divisional of U.S. patent application Ser. No. 16/598,772, filed Oct. 10, 2019, currently granted as U.S. Pat. No. 11,024,535, which claims the benefit of U.S. Provisional Patent Application No. 62/744,038, filed on Oct. 10, 2018. All of these applications and patents are incorporated herein by reference, including their specifications.

FIELD OF THE INVENTION

The present invention relates to semiconductor processing and semiconductor devices, and more particularly, to a method for filling recessed features in semiconductor devices with a low-resistivity metal.

BACKGROUND OF THE INVENTION

Semiconductor devices contain filled recessed features such as trenches or vias that are formed in a dielectric material such as an interlayer dielectric (ILD). Selective metal filling of the recessed features is problematic due to finite metal deposition selectivity on a metal layer at the bottom of the recessed features relative to on the dielectric material. This makes it difficult to fully fill the recessed features with a metal in a bottom-up deposition process before the on-set of unwanted metal nuclei deposition on the field area (horizontal area) around the recessed features and on the sidewalls of the recessed features.

SUMMARY OF THE INVENTION

Embodiments of the invention describe a method of filling recessed features in semiconductor devices with a low-resistivity metal. According to one embodiment, the method includes providing a patterned substrate containing a recessed feature formed in a first layer and a second layer that is exposed in the recessed feature, and pre-treating the substrate with a surface modifier that increases metal deposition selectivity on the second layer relative to on the first layer. The method further includes depositing a metal layer on the substrate by vapor phase deposition, where the metal layer is preferentially deposited on the second layer in the recessed feature, and removing metal nuclei deposited on the first layer, including on a field area and on sidewalls of the first layer in the recessed feature, to selectively form the metal layer on the second layer in the recessed feature. The steps of pre-treating, depositing and removing may be repeated at least once to increase a thickness of the metal layer in the recessed feature.

According to another embodiment, the method includes providing a patterned substrate containing a recessed feature formed in a first layer and a second layer that is exposed in the recessed feature, depositing a metal-containing layer on the substrate, including in the recessed feature, and anisotropically removing the metal-containing layer from a bottom of the recessed feature and from a field area around the recessed feature to form the metal-containing layer on sidewalls of the recessed feature. The method further includes pre-treating the substrate with a surface modifier that increases metal deposition selectivity on the metal-containing layer on the sidewalls of the recessed feature and on the second layer relative to on the first layer, depositing a metal layer on the substrate by vapor phase deposition, where the metal layer is preferentially deposited on the metal-containing layer on the sidewalls and on the second layer in the recessed feature relative to on the field area around the recessed feature, and removing metal nuclei deposited on the field area to selectively form the metal layer in the recessed feature. The steps of pre-treating, depositing and removing may be repeated at least once to increase a thickness of the metal layer in the recessed feature.

According to another embodiment, the method includes providing a patterned substrate containing a recessed feature formed in material, depositing a metal nitride layer on the substrate, including in the recessed feature and on a field area around the recessed feature, and oxidizing the metal nitride layer on the field area. The method further includes depositing a metal layer on the substrate by vapor phase deposition, where the metal layer is preferentially deposited on the metal nitride layer that is not oxidized in the recessed feature, and removing metal nuclei deposited on the field area to selectively form the metal layer in the recessed feature. The steps of depositing and removing may be repeated at least once to increase a thickness of the metal layer in the recessed feature.

According to another embodiment, the method includes providing a patterned substrate containing a recessed feature formed in material, depositing a metal oxide layer on the substrate, including in the recessed feature and on a field area around the recessed feature, nitriding the metal oxide layer on the field area and in the recessed feature, and oxidizing the nitrided metal oxide layer on the field area. The method further includes depositing a metal layer on the substrate by vapor phase deposition, where the metal layer is preferentially deposited on the nitrided metal oxide layer that is not oxidized in the recessed feature, and removing metal nuclei deposited on the field area to selectively form the metal layer in the recessed feature. The steps of depositing and removing may be repeated at least once to increase a thickness of the metal layer in the recessed feature.

According to another embodiment, the method includes providing a patterned substrate containing a recessed feature formed in material, depositing a metal oxide layer on the substrate, including in the recessed feature and on a field area around the recessed feature, and nitriding the metal oxide layer on the field area. The method further includes depositing a metal layer on the substrate by vapor phase deposition, where the metal layer is preferentially deposited on the nitrided metal oxide layer on the field area, and removing metal nuclei deposited in the recessed feature to selectively form the metal layer on the field area. The steps of depositing and removing may be repeated at least once to increase a thickness of the metal layer in the recessed feature.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 4A-4F schematically shows a method for selective metal formation in a recessed feature according to another embodiment of the invention;

DETAILED DESCRIPTION OF SEVERAL EMBODIMENTS

Figure 1A:
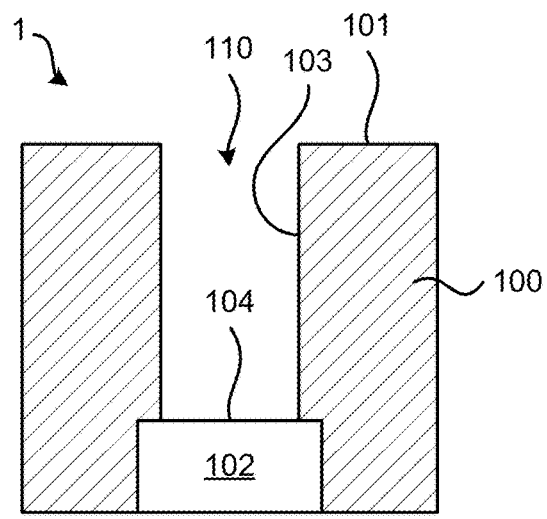
FIGS. 1A-1F schematically show a method for selective metal formation in a recessed feature according to an embodiment of the invention.

Embodiments of the invention provide a method for selectively forming a low-resistivity metal in recessed features of a semiconductor device. The method can be used to fully fill the recessed features with the low-resistivity metal. According to one embodiment, metal deposition selectivity by vapor phase deposition increases in the order: Si-containing material<metal-containing layer<metal. The deposited metal can, for example, include Ru metal, Co metal, or W metal. An incubation time for metal deposition is shortest on a metal and longest on a Si-containing material. An incubation time refers to a delay until metal deposition starts on a surface during a deposition process. In one embodiment, this may be used to preferentially form a metal in a recessed feature relative to on surfaces above the recessed feature. The Si-containing material can include $SiO_2$, SiON, or SiN. The $SiO_2$ may be deposited as a layer or formed by oxidation of Si, for example by exposure to air, oxygen ($O_2$ or O), ozone, or $H_2O$. The SiN may be deposited as a layer or formed by nitridation of Si, for example by exposure to N or $NH_3$. The SiON may be deposited as a layer or formed by nitriding $SiO_2$, by oxidation of SiN, or by oxidation and nitridation of Si. The metal-containing layer can include a metal oxide, a metal nitride, a metal carbide, a metal silicide, a metal sulfide, or a metal phosphide. The metal silicide may be formed by metal deposition on Si or Si deposition on a metal, followed by a heat-treatment, or by formation of the metal silicide during a deposition process. The metal can, for example, include Ru metal, Co metal, or W metal.

FIGS. 1A-1F schematically shows a method for selective metal formation in a recessed feature according to an embodiment of the invention. The metal can, for example, be selected from the group consisting of Ru metal, Co metal, and W metal. The patterned substrate 1 contains a field area 101 around a recessed feature 110 formed in a first layer 100. The recessed feature 110 contains sidewalls 103 and a second layer 102 that has an exposed surface 104.

According to one embodiment, the first layer 100 can include a dielectric material and the second layer 102 can include a metal layer. The dielectric material can, for example, contain $SiO_2$, a low dielectric constant (low-k) material such as fluorinated silicon glass (FSG), carbon doped oxide, a polymer, a SiCOH-containing low-k material, a non-porous low-k material, a porous low-k material, a CVD low-k material, a spin-on dielectric (SOD) low-k material, or any other suitable dielectric material, including a high dielectric constant (high-k) material. In some examples, a width (critical dimension (CD)) of the recessed feature 110 can be between about 10 nm and about 100 nm, between about 10 nm and about 15 nm, between about 20 nm and about 90, or between about 40 nm and about 80 nm. In some examples, the depth of the recessed feature 110 can between bout 40 nm and about 200 nm, or between about 50 nm and about 150 nm. In some examples, and the recessed feature 110 can have an aspect ratio (depth/width) between about 2 and about 20, or between about 4 and about 6. The second layer 102 can include a low-resistivity metal such as Cu metal, Ru metal, Co metal, W metal, or a combination thereof. In one example, the second layer 102 can include two or more stacked metal layers. Examples of the stacked metal layers include Co metal on Cu metal (Co/Cu) and Ru metal on Cu metal (Ru/Cu).

The method includes pre-treating the patterned substrate 1 with a surface modifier that adsorbs on the first layer 100 and thereby increases metal deposition selectivity on the second layer 102 relative to on the first layer 100, including on the sidewalls 103 and on the field area 101. The presence of the surface modifier hinders deposition of the metal layer on first layer 100 but the second layer 102 is not modified. According to one embodiment, the patterned substrate 1 is pre-treated with a surface modifier by exposure to a reactant gas that contains a molecule that is capable of forming self-assembled monolayers (SAMs) on a substrate. SAMs are molecular assemblies that are formed spontaneously on substrate surfaces by adsorption and are organized into more or less large ordered domains. The SAMs can include a molecule that possesses a head group, a tail group, and a functional end group, and SAMs are created by the chemisorption of head groups onto the substrate from the vapor phase at room temperature or above room temperature, followed by a slow organization of the tail groups. Initially, at small molecular density on the surface, adsorbate molecules form either a disordered mass of molecules or form an ordered two-dimensional "lying down phase", and at higher molecular coverage, over a period of minutes to hours, begin to form three-dimensional crystalline or semicrystalline structures on the substrate surface. The head groups assemble together on the substrate, while the tail groups assemble far from the substrate. According to one embodiment, the head group of the molecule forming the SAMs can include a thiol, a silane, or a phosphonate. Examples of silanes include molecule that include C, H, Cl, F, and Si atoms, or C, H, Cl, and Si atoms. Non-limiting examples of the molecule include perfluorodecyltrichlorosilane ($CF_3(CF_2)_7CH_2CH_2SiCl_3$), perfluorodecanethiol ($CF_3(CF_2)_7CH_2CH_2SH$), chlorodecyldimethylsilane ($CH_3(CH_2)_8CH_2Si(CH_3)_2Cl$), and tertbutyl(chloro)dimethylsilane (($CH_3)_3CSi(CH_3)_2Cl$)).

According to some embodiments of the invention, the reactant gas can contain a silicon-containing gas, including an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, a silazane, or any combination thereof. According to some embodiments of the invention, the reactant gas may be selected from dimethylsilane dimethylamine (DMSDMA), trimethylsilane dimethylamine (TMSDMA), bis(dimethylamino) dimethylsilane (BDMADMS), and other alkyl amine silanes. According to other embodiments, the reactant gas may be selected from N,O bistrimethylsilyltrifluoroacetamide (BSTFA) and trimethylsilyl-pyrrole (TMS-pyrrole).

According to some embodiments of the invention, the reactant gas may be selected from silazane compounds.

Silazanes are saturated silicon-nitrogen hydrides. They are analogous in structure to siloxanes with —NH— replacing —O—. An organic silazane precursor can further contain at least one alkyl group bonded to the Si atom(s). The alkyl group can, for example, be a methyl group, an ethyl group, a propyl group, or a butyl group, or combinations thereof. Furthermore, the alkyl group can be a cyclic hydrocarbon group such as a phenyl group. In addition, the alkyl group can be a vinyl group. Disilazanes are compounds having from 1 to 6 methyl groups attached to the silicon atoms or having 1 to 6 ethyl groups attached the silicon atoms, or a disilazane molecule having a combination of methyl and ethyl groups attached to the silicon atoms.

The method further includes depositing a metal layer 106a on the patterned substrate 1 by vapor phase deposition, where the metal layer 106a is preferentially deposited on the second layer 102 in the recessed feature 110. The metal layer 106a can, for example, be selected from the group consisting of Ru metal, Co metal, and W metal. According to one embodiment of the invention, Ru metal may be deposited by chemical vapor phase deposition (CVD) or atomic layer deposition (ALD). Examples of Ru-containing precursors include $Ru_3(CO)_{12}$, (2,4-dimethylpentadienyl) (ethylcyclopentadienyl) ruthenium (Ru(DMPD)(EtCp)), bis(2,4-dimethylpentadienyl) ruthenium (Ru(DMPD)$_2$), 4-dimethylpentadienyl) (methylcyclopentadienyl) ruthenium (Ru(DMPD)(MeCp)), and bis(ethylcyclopentadienyl) ruthenium (Ru(EtCp)$_2$), as well as combinations of these and other precursors.

Figure 1B:
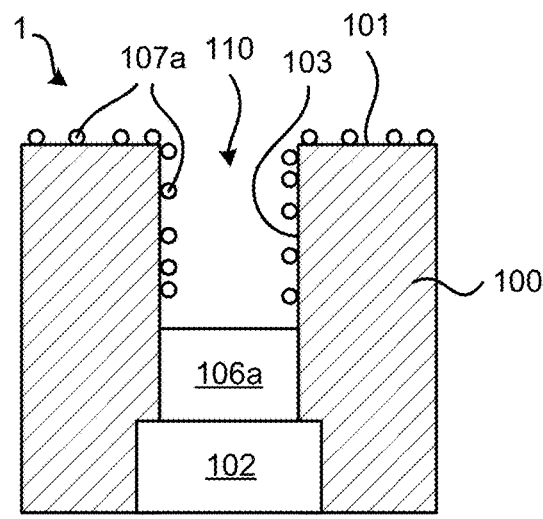

As schematically shown in FIG. 1B, the metal deposition may not be completely selective and metal nuclei 107a may be deposited on the sidewalls 103 and on the field area 101. Unlike the metal layer 106a, the metal nuclei 107a may be form a non-continuous layer where the total amount of the metal in the metal nuclei 107a is less than the amount of the metal in the metal layer 106a.

In one example, Ru metal was deposited by CVD using a $Ru_3(CO)_{12}$ precursor in a CO carrier gas. After pre-treating the substrate with a surface modifier, Ru metal nuclei were observed on a dielectric material after a thickness of about 15-20 nm of Ru metal was deposited on a Cu metal layer at a bottom of a recessed feature in the dielectric material. This illustrates the limited selectivity of Ru metal deposition on different materials and the difficulty of selectively depositing and filling recessed features deeper than about 15-20 nm with Ru metal before the onset of Ru metal deposition on dielectric surfaces. Ru metal deposition rates by CVD were observed to decrease in the order: metal>metal nitride or nitride metal oxide>metal oxide or oxidized metal nitride>ILD, where the Ru metal deposition rate is highest on a metal surface and lowest on an ILD surface. This may be utilized for preferential Ru metal deposition on the different materials. ILDs include dielectric compounds that contain silicon, carbon, or both silicon and carbon. Examples include $SiO_2$, SiON, SiN, SiCOH, Si, SiC, and C.

Figure 1C:
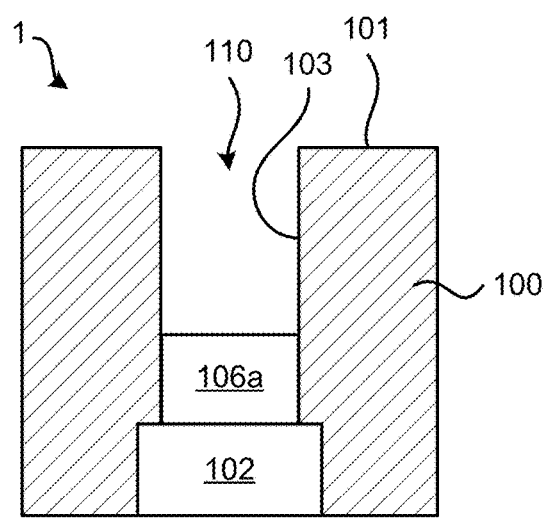

The method further includes removing the metal nuclei 107a from the patterned substrate 1 to selectively form the metal layer 106a on the second layer 102 in the recessed feature 110. This is schematically shown in FIG. 1C. It is may be preferable that the removal of the metal nuclei 107a be performed before they get too big and are more difficult to remove efficiently. In one example, Ru metal nuclei 107a may be removed by etching using reactive ion etching (ME), for example using plasma-excited $O_2$ gas and optionally adding a halogen-containing gas (e.g., $Cl_2$).

Figure 1D:
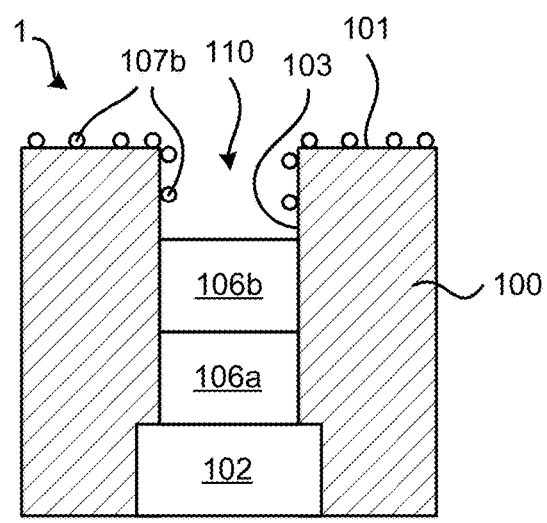
Figure 1E:
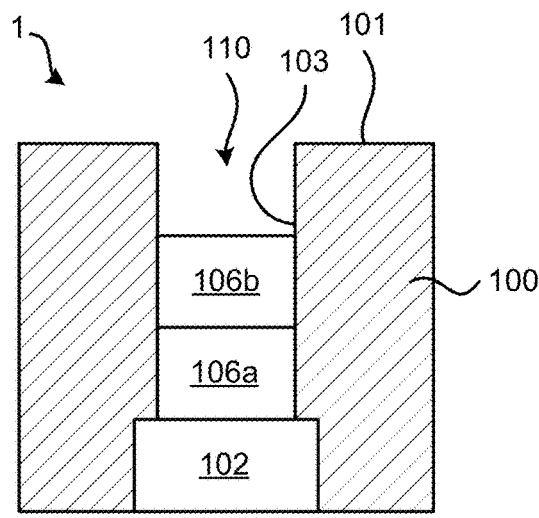
Figure 1F:
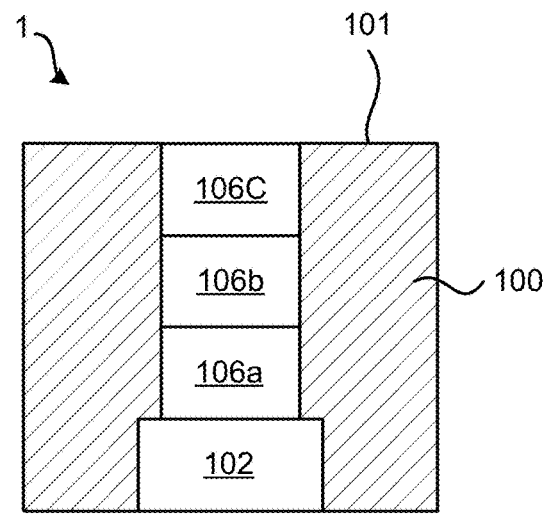

The steps of pre-treating, depositing and removing may be repeated at least once to increase a thickness of the metal deposited in the recessed feature 110. This is schematically shown in FIG. 1D where additional metal layer 106b is preferentially deposited on the metal layer 106a and additional metal nuclei 107b are deposited on the sidewalls 103 and on the field area 101. Thereafter, as shown in FIG. 1E, the additional metal nuclei 107b are removed. In one example, the pre-treating, depositing and removing may be repeated until the recessed feature 110 is fully filled with the metal. This is schematically shown in FIG. 1F, where the recessed feature 110 is filled with metal layers 106a-106c.

A process example for selective Ru metal formation in a recessed feature includes a pre-treatment using a TMSDMA gas exposure where TMSDMA liquid is vaporized and diluted with $N_2$ gas, a substrate temperature between about 180° C. and about 250° C., a process chamber pressure of about 5 Torr, and a 10 sec exposure time with no plasma excitation. A Ru metal CVD process includes a process gas containing $Ru_3(CO)_{12}$+CO (e.g., a gas flow ratio of about 1:100), a substrate temperature between about 135° C. and about 180° C. (for example about 160° C.), a process chamber pressure between about 1 mTorr and about 20 mTorr (for example about 5 mTorr), and a 400 sec exposure without plasma excitation that deposits about 20 nm of Ru metal on a metal surface. A Ru metal removal process includes the use of an etching gas of containing $O_2$ and $Cl_2$ (e.g., a gas flow ratio of about 100:1), a substrate temperature between about room temperature and about 370° C. (for example about 370° C.), plasma excitation using a capacitively coupled plasma source with about 1200 W of RF power applied to a top electrode and between about 0W and about 300 W (for example 0W) of RF power applied to a bottom electrode (substrate holder), a process chamber pressure of about 5 mTorr, and a 40 sec exposure time to remove the equivalent of about 5 nm of Ru metal nuclei.

Figure 7:
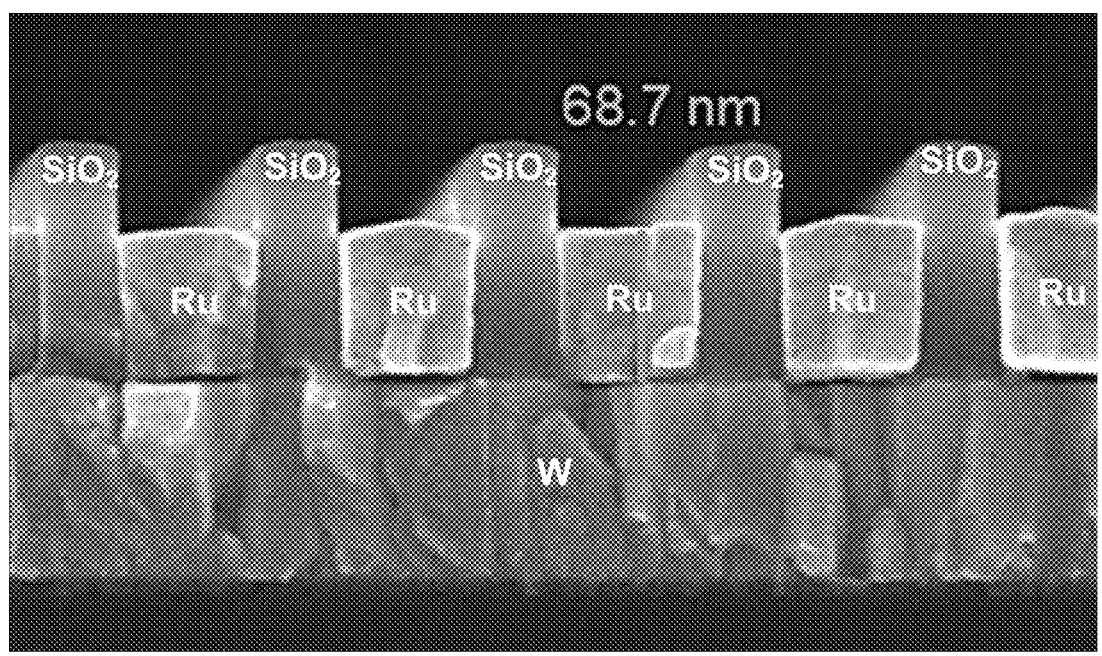
FIG. 7 shows a SEM image with selective Ru metal formation in recessed features on a patterned substrate.

FIG. 7 shows a SEM image with selective Ru metal formation in recessed features on a patterned substrate. The as-received patterned substrate contained raised $SiO_2$ features on a W metal film. The raised $SiO_2$ features were about 113 nm tall, about 31 nm wide, and were spaced apart by about 87 nm. The raised $SiO_2$ features formed recessed features that were about 113 nm deep and with a width of about 87 nm. The figure shows the results following a deposition process that included pre-treating the patterned substrate with a surface modifier containing TMSDMA, a Ru metal CVD deposition step using $Ru_3(CO)_{12}$+CO, and a Ru metal etching step using plasma-excited $O_2$ gas+$Cl_2$ gas that removed Ru metal nuclei from the sidewalls of the recessed features. The sequence of pre-treating, Ru metal depositing, and Ru metal nuclei removal was performed four times. The figure illustrates that Ru metal was selectively formed in the recessed features and no Ru metal nuclei were present on the sidewalls of the recessed features or on the top surfaces of the etched $SiO_2$ features. The thickness of the Ru metal formed in the recessed features was about 69 nm and filled about 61% of the volume of the recessed features.

Figure 2A:
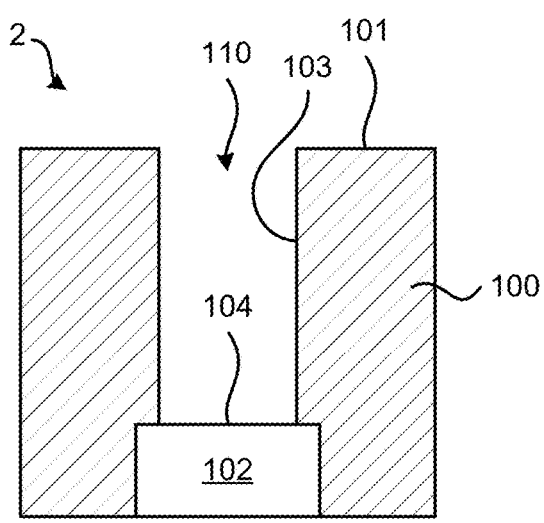
FIGS. 2A-2E schematically show a method for selective metal formation in a recessed feature according to another embodiment of the invention.
Figure 2B:
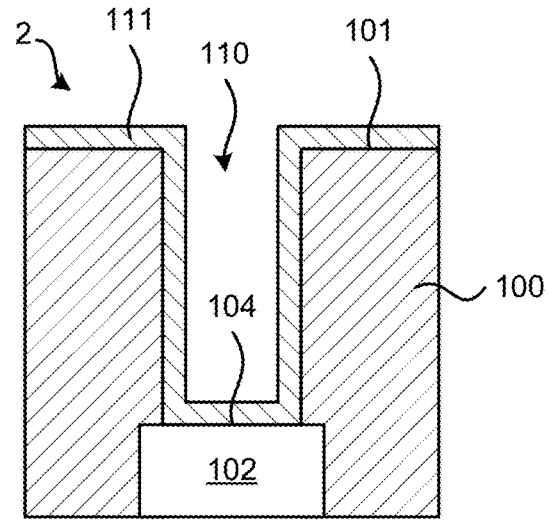

FIGS. 2A-2F schematically shows a method for selective metal formation in a recessed feature according to another embodiment of the invention. FIG. 1A has been reproduced as patterned substrate 2 in FIG. 2A. The method includes providing the patterned substrate 2 containing a recessed feature 110 formed in a first layer 100 and a second layer 102 that is exposed in the recessed feature 110. As shown in FIG. 2B, the method includes depositing a metal-containing layer 111 on the patterned substrate 2, including in the recessed feature 110 and on the field area 101 around the recessed feature 110. The metal-containing layer 111 may be conformal and in some examples, the metal-containing layer 111 can include a metal oxide, a metal nitride, or a combination thereof. The metal oxide can, for example, include $Al_2O_3$, $TiO_2$, $HfO_2$, or $MnO_2$, and the metal nitride can, for example, include AlN, TiN, HfN, or MnN.

Figure 2C:
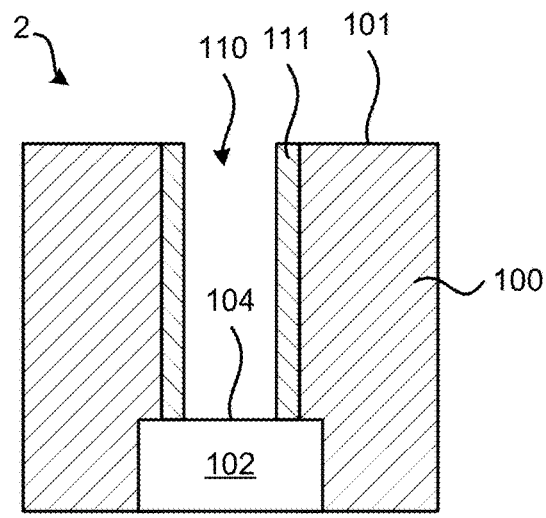

Thereafter, as shown in FIG. 2C, the method further includes anisotropically removing the metal-containing layer 111 from a bottom of the recessed feature 110 and from the field area 101 around the recessed feature 110 to form the metal-containing layer 111 on the sidewalls 103 of the recessed feature 110. The method further includes pre-treating the patterned substrate 2 with a surface modifier that that adsorbs on the first layer 100, including on the field area 101, and thereby increases metal deposition selectivity on the metal-containing layer 111 on the sidewalls 103 of the recessed feature 110 and on the second layer 102 relative to on the first layer 100.

Figure 2D:
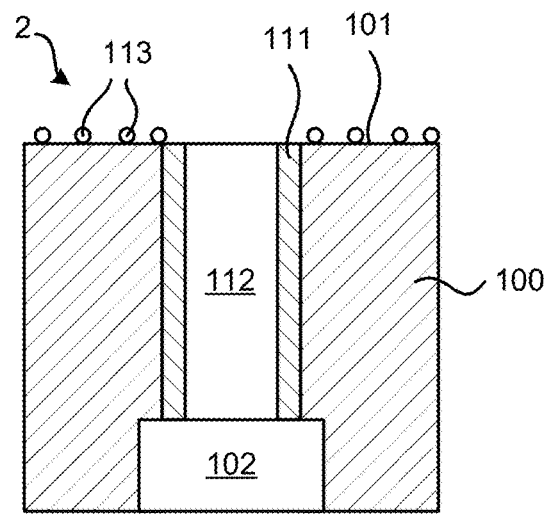
Figure 2E:
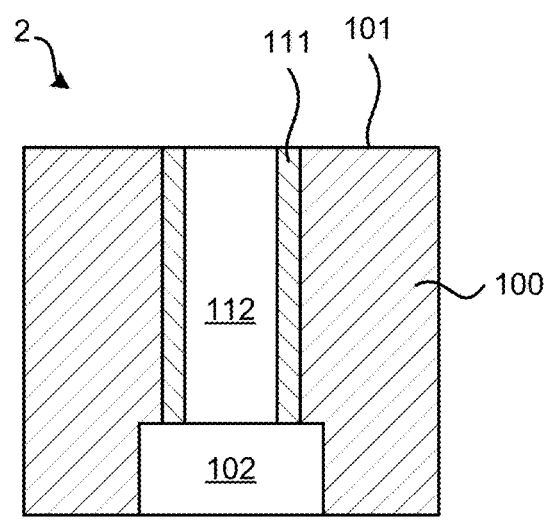

The method further includes depositing a metal layer 112 on the patterned substrate 2 by vapor phase deposition, where the metal layer 112 is preferentially deposited on the metal-containing layer 111 on the sidewalls 103 and on the second layer 102 at the bottom of the recessed feature 110, relative to on the field area 101 around the recessed feature 110. The metal layer 112 can, for example, be selected from the group consisting of Ru metal, Co metal, and W metal. As schematically shown in FIG. 2D, the metal deposition may not be completely selective and metal nuclei 113 may be deposited on the field area 101. Unlike the metal layer 112, the metal nuclei 113 may be form a non-continuous layer where the total amount of the metal in the metal nuclei 113 is less than the amount of the metal in the metal layer 112. According to the embodiment shown in FIG. 2D, the metal layer 112 may fully fill the recessed feature 110. As shown in FIG. 2E, the method further includes removing the metal nuclei 113 deposited on the field area 101 of the first layer 100 around the recessed feature 110 to selectively form the metal layer 112 in the recessed feature 110.

According to another embodiment, the metal layer 112 may not fully fill the recessed feature 110, and the pre-treating, depositing and removing may be repeated at least once to increase a thickness of the metal deposited in the recessed feature 110. According to one embodiment, the pre-treating, depositing and removing may be repeated until the recessed feature 110 is fully filled with the metal.

Figure 3A:
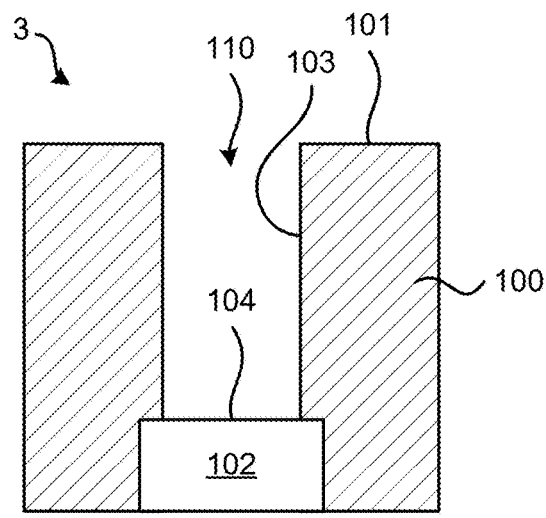
FIGS. 3A-3E schematically show a method for selective metal formation in a recessed feature according to another embodiment of the invention.
Figure 3B:
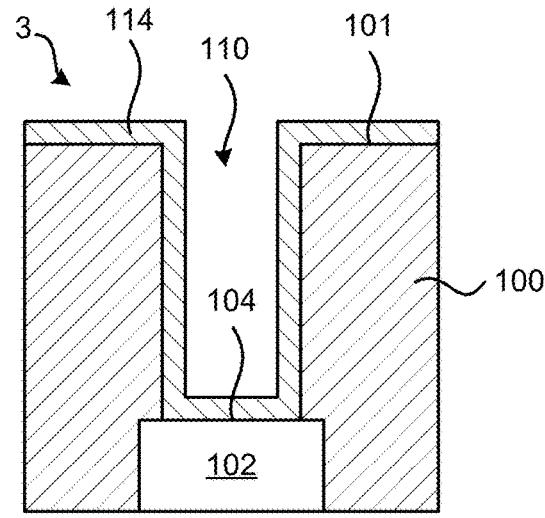

FIGS. 3A-3E schematically shows a method for selective metal formation in a recessed feature according to another embodiment of the invention. FIG. 1A has been reproduced as patterned substrate 3 in FIG. 3A. The method includes providing the patterned substrate 3 containing a recessed feature 110 formed in a material. In one example, the material can include a first layer 100 and a second layer 102 that is exposed in the recessed feature 110. As shown in FIG. 3B, the method further includes depositing a metal nitride layer 114 on the patterned substrate 3, including in the recessed feature 110 and on the field area 101 around the recessed feature 110. The metal nitride layer 114 may be conformal, and in some examples, the metal nitride layer 114 can include AlN, TiN, HfN, or MnN.

Figure 3C:
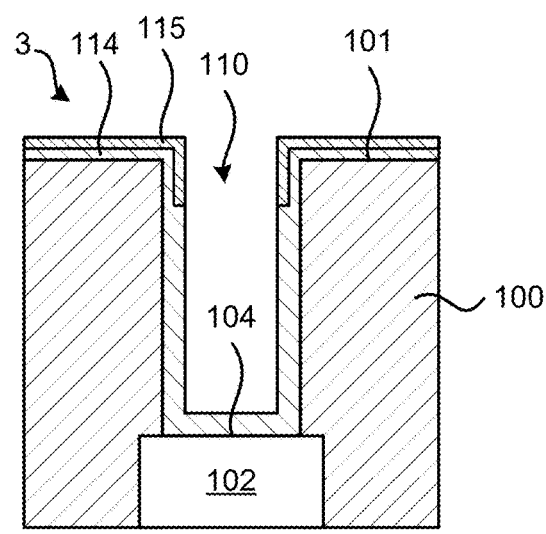

Thereafter, the method further includes oxidizing the metal nitride layer 114 on the field area 101 to form an oxidized metal nitride layer 115. As used herein, the oxidizing process incorporates oxygen into at least a surface region of the metal nitride layer 114. As schematically shown in FIG. 3C, the metal nitride layer 114 may also be oxidized in the recessed feature 110 near the opening of the recessed feature 110. The step of oxidizing the metal nitride layer 114 can be performed using plasma-excited $O_2$ gas, where the small opening of the recessed feature 110 limits the penetration of the plasma-excited $O_2$ gas into the recessed feature 110. This limits the oxidation of the metal nitride layer 114 to the field area 101 and an upper portion of the recessed feature 110.

Figure 3D:
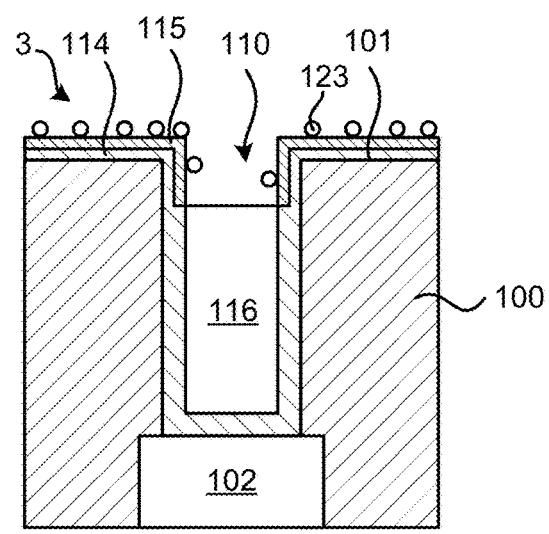

The method further includes depositing a metal layer 116 on the substrate by vapor phase deposition, where the metal layer 116 is preferentially deposited on the metal nitride layer 114 that is not oxidized in the recessed feature 110. The preferential metal deposition is believed to be due to a shorter incubation time for the metal deposition on the metal nitride layer 114 relative to on the oxidized metal nitride layer 115. As schematically shown in FIG. 3D, the metal deposition may not be completely selective and metal nuclei 123 may be deposited on the field area 101. Unlike the metal layer 116, the metal nuclei 123 may be form a non-continuous layer where the total amount of the metal in the metal nuclei 123 is less than the amount of the metal in the metal layer 116.

Figure 3E:
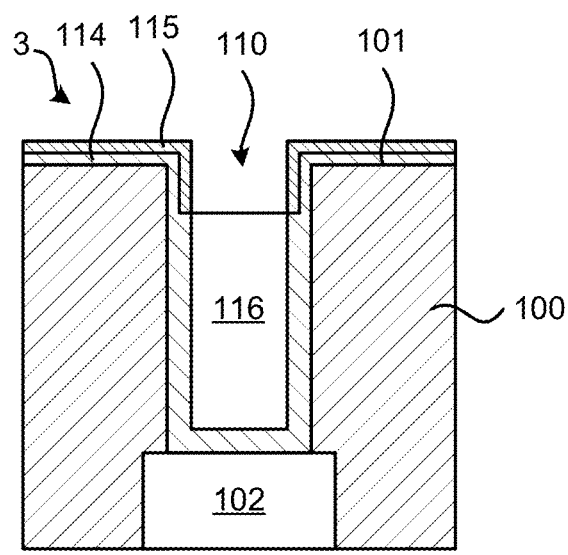

According to the embodiment shown in FIG. 3D, the metal layer 116 may fully fill the recessed feature 110 where oxidation of the metal nitride layer 114 is avoided. As shown in FIG. 3E, the method further includes removing the metal nuclei 123 deposited on the field area 101 of the first layer 100 around the recessed feature 110 to selectively form the metal layer 116 in the recessed feature 110.

According to another embodiment, the metal layer 116 may not fully fill the recessed feature 110 where oxidation of the metal nitride layer 114 is avoided, and the steps of depositing and removing may be repeated at least once to increase a thickness of the metal layer 116 deposited in the recessed feature 110. According to one embodiment, the steps of depositing and removing may be repeated until the recessed feature 110 is fully filled with the metal layer 116.

Figure 4A:
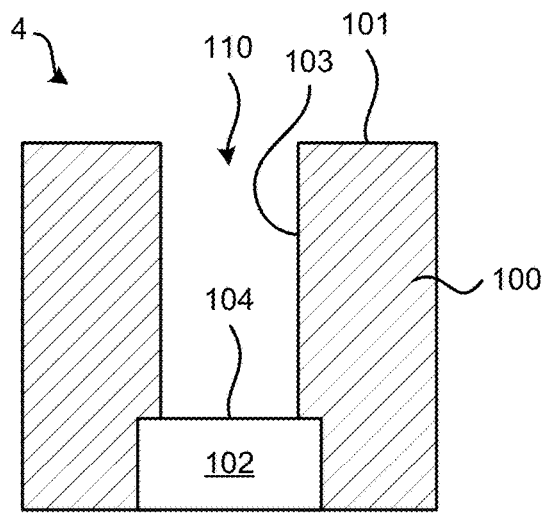
Figure 4B:
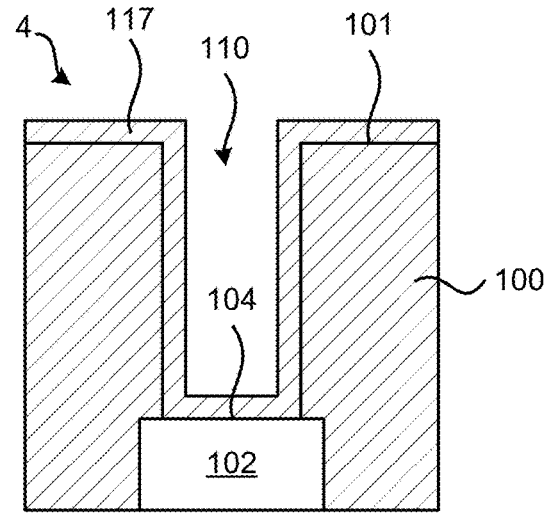

FIGS. 4A-4F schematically shows a method for selective metal formation in a recessed feature according to another embodiment of the invention. FIG. 1A has been reproduced as patterned substrate 4 in FIG. 4A. The method includes providing the patterned substrate 4 containing a recessed feature 110 formed in a material. In one example, the material can include a first layer 100 and a second layer 102 that is exposed in the recessed feature 110. As shown in FIG. 4B, the method further includes depositing a metal oxide layer 117 on the patterned substrate 4, including in the recessed feature 110 and on the field area 101 around the recessed feature 110. The metal oxide layer 117 may be conformal, and in some examples, the metal oxide layer 117 can include $Al_2O_3$, $TiO_2$, $HfO_2$, or $MnO_2$.

Figure 4C:
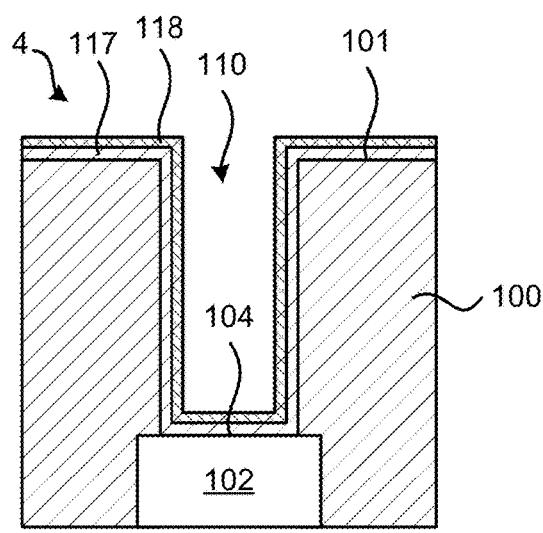

Thereafter, the method further includes nitriding the metal oxide layer 117 on the field area 101 and in the recessed feature 110 to form a nitrided metal oxide layer 118. As used herein, the nitriding process incorporates nitrogen into at least a surface region of the metal oxide layer 117. As schematically shown in FIG. 4C, the nitrided metal oxide layer 118 may be conformal. The step of nitriding the metal oxide layer 117 may be carried out using a thermal nitriding process (e.g., $NH_3$ anneal in the absence of a plasma) that effectively nitrides at least a portion of the thickness of the entire metal oxide layer 117, including in the recessed feature 110.

Figure 4D:
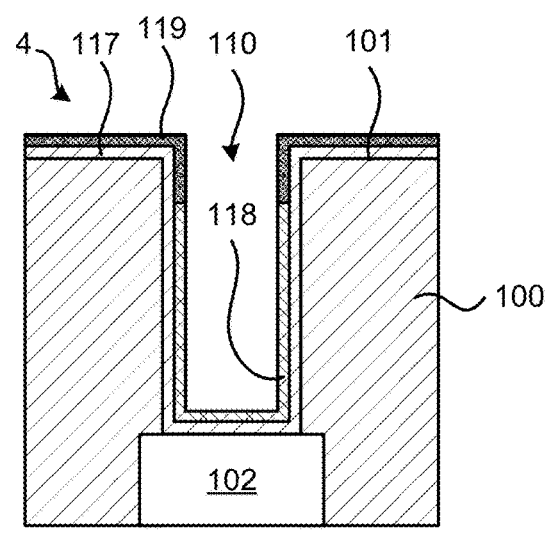

Thereafter, the method further includes oxidizing the nitrided metal oxide layer 118 on the field area 101 to form an oxidized nitrided metal oxide layer 119. As used herein, the oxidizing process incorporates oxygen into at least a surface region of the nitrided metal oxide layer 118. The step of oxidizing the nitrated metal oxide layer can be performed using plasma-excited $O_2$ gas, where the small opening of the recessed feature 110 limits the penetration of the plasma-excited O₂ gas into the recessed feature 110. This limits the oxidation of the nitrited metal oxide layer to the field area 101 and an upper portion of the recessed feature 110. This is schematically shown in FIG. 4D.

The method further includes depositing a metal layer 120 on the patterned substrate 4 by vapor phase deposition, where the metal layer 120 is preferentially deposited on the nitrided metal oxide layer 118 that is not oxidized in the recessed feature 110. The preferential metal deposition is believed to be due to a shorter incubation time for the metal deposition on the nitrated metal oxide layer relative to on the oxidized nitrided metal oxide layer 119.

As schematically shown in FIG. 4E, the metal deposition may not be completely selective and metal nuclei 121 may be deposited on the oxidized nitrided metal oxide layer 119 on the field area 101. Unlike the metal layer 120, the metal nuclei 121 may be form a non-continuous layer where the total amount of the metal in the metal nuclei 121 is less than the amount of the metal in the metal layer 120.

According to the embodiment shown in FIG. 4E, the metal layer 120 may fully fill the recessed feature 110 where oxidation of the nitrided metal oxide layer 118 is avoided. As shown in FIG. 4F, the method further includes removing the metal nuclei 121 deposited on the field area 101 of the first layer 100 around the recessed feature 110 to selectively form the metal layer 120 in the recessed feature 110.

According to another embodiment, the metal layer 120 may not fully fill the recessed feature 110 where oxidation of the nitrided metal oxide layer 118 is avoided, and the steps of depositing and removing may be repeated at least once to increase a thickness of the metal layer 120 deposited in the recessed feature 110. According to one embodiment, the steps of depositing and removing may be repeated until the recessed feature 110 is fully filled with the metal layer 120.

Figure 5A:
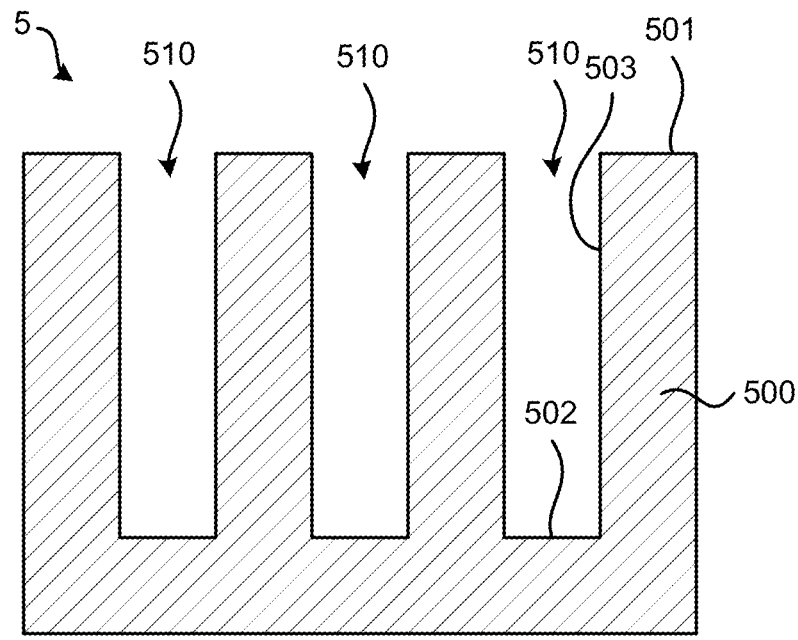
FIGS. 5A-5E schematically shows a method for selective metal formation in a recessed feature according to another embodiment of the invention.
Figure 5B:
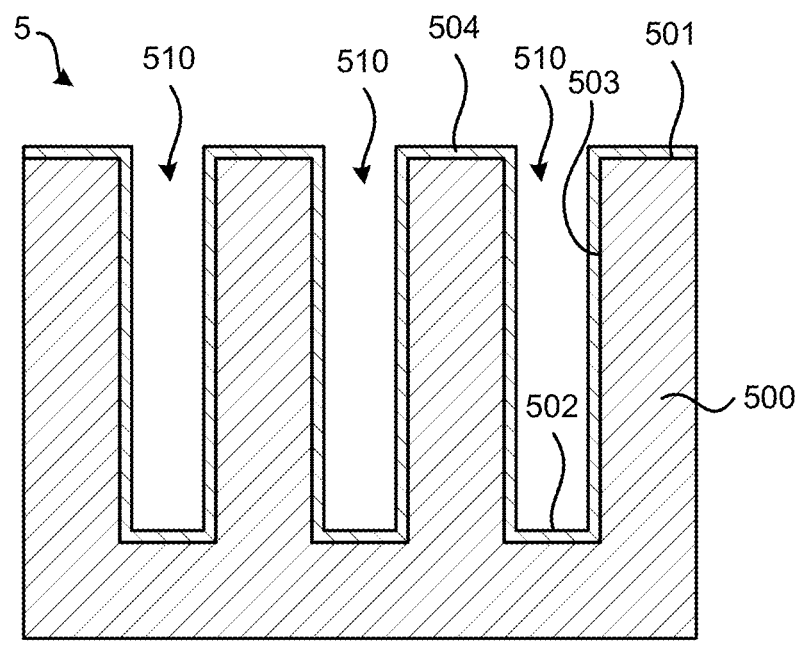

FIGS. 5A-5D schematically shows a method for selective metal formation in a recessed feature according to another embodiment of the invention. FIG. 5A shows a patterned substrate 5 containing recessed features 510 formed in a material 500, where the recessed features contain sidewalls 503 and bottom 502. The method includes depositing a metal oxide layer 504 on the patterned substrate 5, including in the recessed features 510 and on a field area 501 around the recessed features 510. This is schematically shown in FIG. 5B.

Figure 5C:
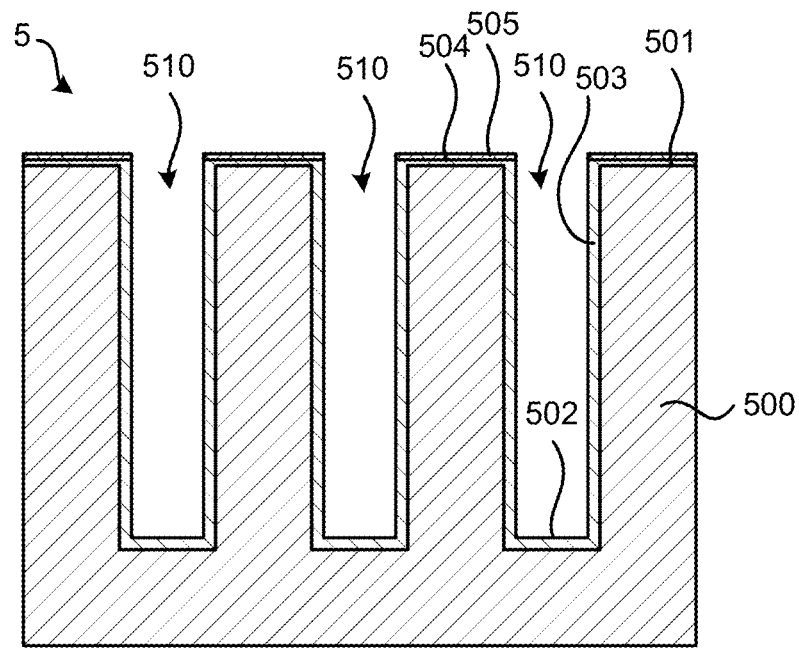

The method further includes nitriding the metal oxide layer 504 on the field area 101. As used herein, the nitriding process incorporates nitrogen into at least a surface region of the metal oxide layer 504 to form a nitrided metal oxide layer 505. This is schematically shown in FIG. 5C. The step of nitriding the metal oxide layer 504 can be performed using plasma-excited nitrogen-containing gas (e.g., N₂ or NH₃), where the small openings of the recessed features 510 limit the penetration of the plasma-excited nitrogen-containing gas into the recessed features 510.

Figure 5D:
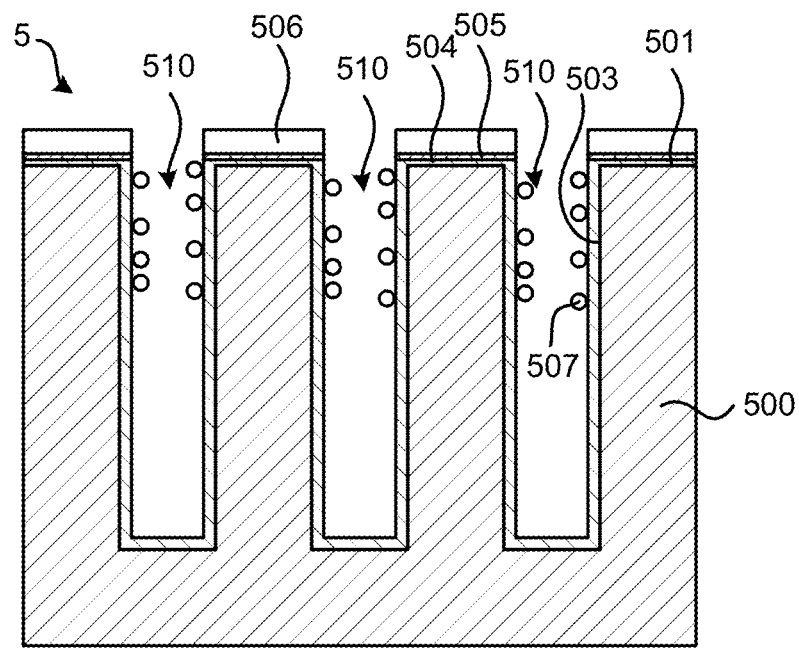

The method further includes depositing a metal layer 506 on the patterned substrate 5 by vapor phase deposition, where the metal layer 506 is preferentially deposited on the nitrided metal oxide layer 505 on the field area 501. As schematically shown in FIG. 5D, the metal deposition may not be completely selective and metal nuclei 507 may be deposited on the metal oxide layer 504 in the recessed features 510.

Figure 5E:
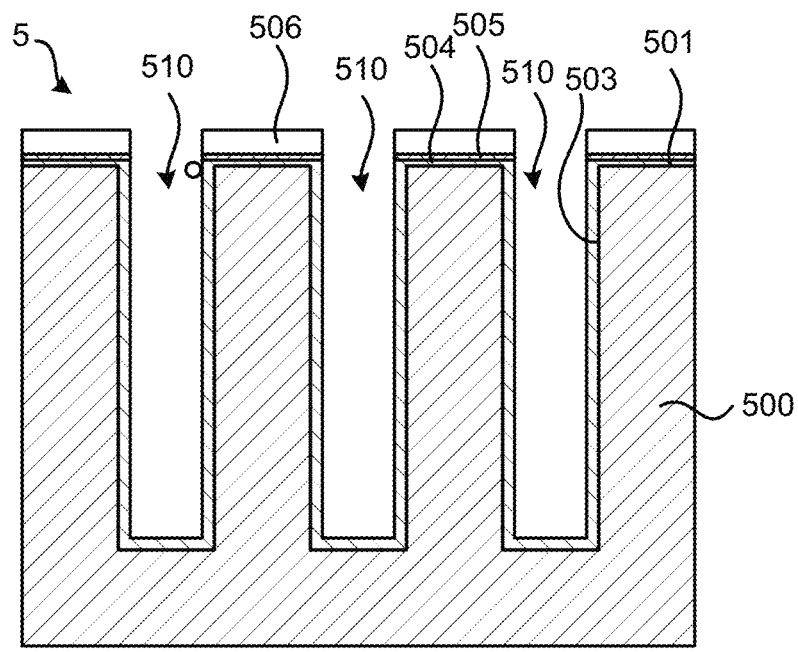

The method further includes removing the metal nuclei 507 deposited in the recessed features 510 to selectively form the metal layer 506 on the field area 501. This is schematically shown in FIG. 5E. The steps of depositing and removing may be repeated at least once to increase a thickness of the metal layer 506 on the field area 501.

Figure 6A:
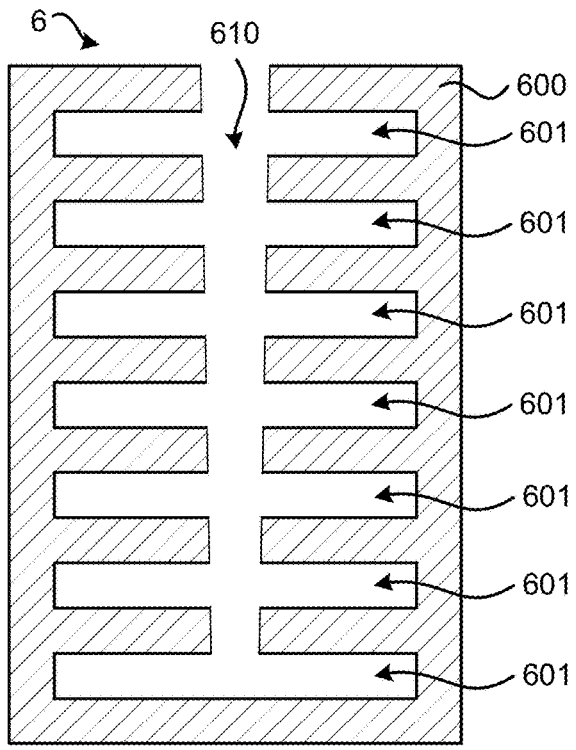
FIGS. 6A-6D schematically shows a method for selective metal formation in a recessed feature according to another embodiment of the invention.
Figure 6B:
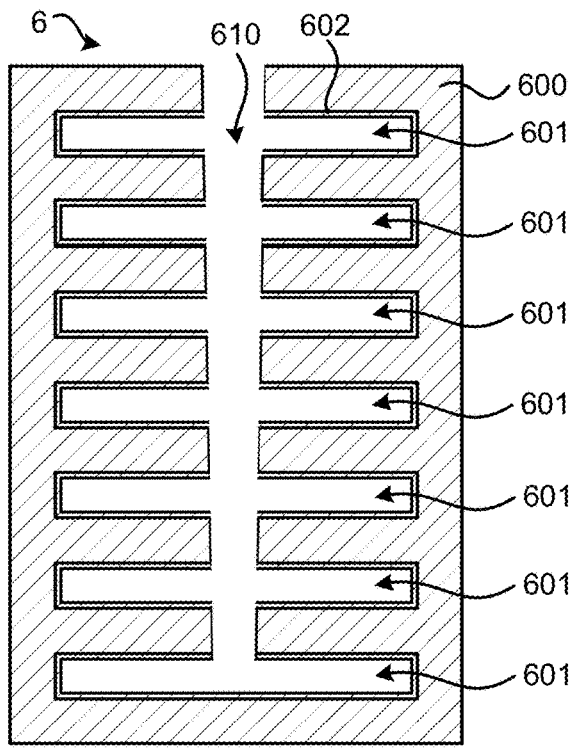
Figure 6C:
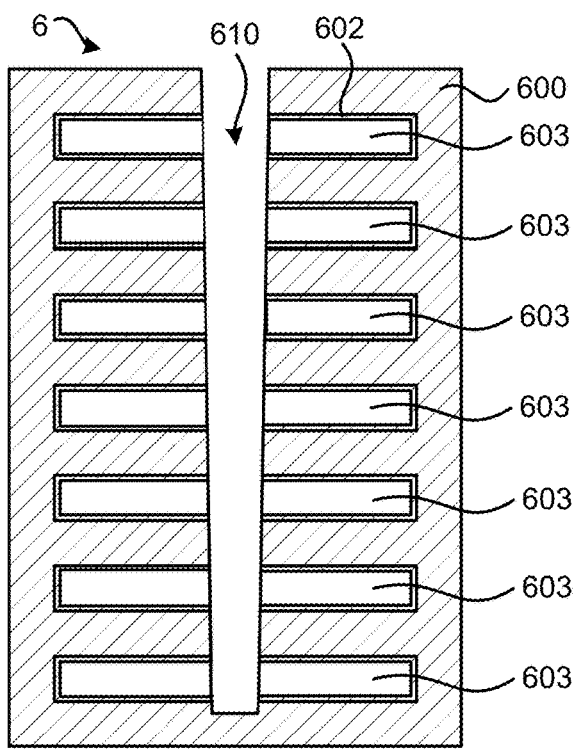
Figure 6D:
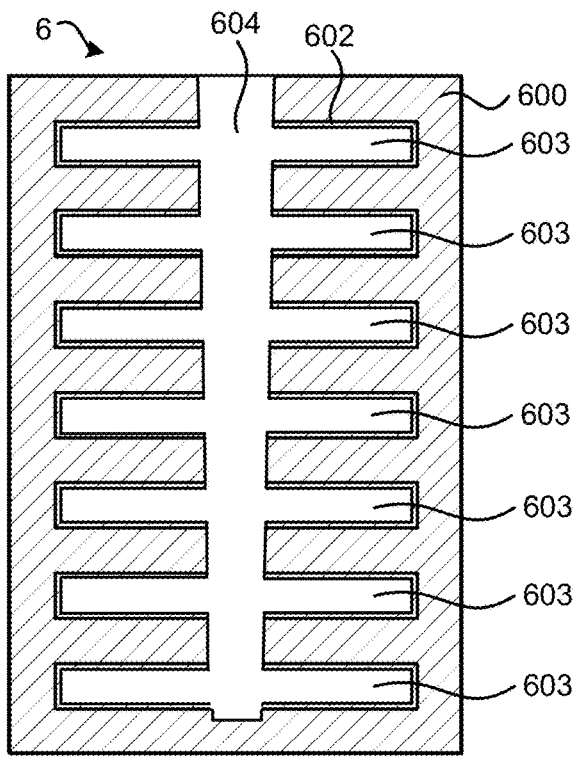

FIGS. 6A-6D schematically shows a method for selective metal formation in a recessed feature according to another embodiment of the invention. In one example, shown in FIG. 6A, the patterned substrate 6 may include a portion of a 3D NAND device. The method include providing a patterned substrate 6 containing an etched vertical feature 610 and etched horizontal features 601 in a material 600. The etched vertical feature 610 may be tapered with a larger opening near the top than near the bottom. In one example, the material 600 may include SiO₂ or SiN. The method further includes nitriding the etched vertical feature 610 and the etched horizontal features 601 to form a nitrided layer 602. The process of nitriding can include a thermal nitriding process (e.g., NH₃ anneal in the absence of a plasma) that nitrides both the etched vertical feature 610 and etched horizontal features 601. Thereafter, the method includes a plasma treatment (e.g., an Ar plasma) that removes the nitrided layer 602 from the etched vertical feature 610, while retaining the nitrided layer 602 in the etched horizontal features 601. The resulting patterned substrate 6 is shown in FIG. 6B. The method further includes depositing a metal layer 603 on the patterned substrate 6 by vapor phase deposition, where the metal layer 603 is preferentially deposited on the nitrided layer 602 in the etched horizontal features 601 relative to on the etched vertical feature 610. This is shown in FIG. 6C. The vapor phase deposition is performed until the etched vertical feature 610 is also fully filled with a metal layer 604. The selective metal deposition is due to a higher metal deposition rate on the nitrided layer 602 than on the etched vertical feature 610 that is not nitrided. This allows for complete metal filling of the etched vertical feature 610 and the etched horizontal features 601 without any voids.

A method for filling recessed features in semiconductor devices with a low-resistivity metal has been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:
1. A method of forming a semiconductor device, the method comprising:
   providing a patterned substrate containing a recessed feature formed in a first layer and a second layer that is exposed in the recessed feature;
   depositing a metal-containing layer on the patterned substrate, including in the recessed feature;
   anisotropically removing the metal-containing layer from a bottom of the recessed feature and from a field area around the recessed feature to form the metal-containing layer on sidewalls of the recessed feature;
   pre-treating the patterned substrate with a surface modifier that increases metal deposition selectivity on the metal-containing layer on the sidewalls of the recessed feature and on the second layer relative to on the first layer;

depositing a metal layer on the patterned substrate by vapor phase deposition, where the metal layer is preferentially deposited on the metal-containing layer on the sidewalls and on the second layer in the recessed feature, relative to on the field area around the recessed feature; and removing metal nuclei deposited on the field area to selectively form the metal layer in the recessed feature.

2. The method of claim 1, further comprising:
repeating the pre-treating, depositing and removing at least once to increase a thickness of the metal layer in the recessed feature.

3. The method of claim 1, wherein the pre-treating includes forming self-assembled monolayers (SAMs) on the second layer.

4. The method of claim 1, wherein the metal layer is selected from the group consisting of Ru metal, Co metal, and W metal, and the second layer is selected from the group consisting of Cu metal, Ru metal, Co metal, W metal, and a combination thereof.

5. The method of claim 1, wherein the metal-containing layer contains a metal oxide, a metal nitride, or a combination thereof.

6. The method of claim 1, wherein the metal oxide includes $Al_2O_3$, $TiO_2$, $HfO_2$, or $MnO_2$, and the metal nitride includes AlN, TiN, HfN, or MnN.

7. The method of claim 1, wherein the first layer includes a dielectric material and the second layer includes an initial metal layer.

8. The method of claim 1, wherein the pre-treating includes exposing the patterned substrate to a silicon-containing gas.

9. The method of claim 8, wherein the silicon-containing gas includes an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, a silazane, or combination thereof.

10. The method of claim 8, wherein the silicon-containing gas includes dimethylsilane dimethylamine (DMSDMA), trimethylsilane dimethylamine (TMSDMA), or bis(dimethylamino) dimethylsilane (BDMADMS).

11. The method of claim 8, wherein the silicon-containing gas includes N,O-bistrimethylsilyltrifluoroacetamide (BSTFA) or trimethylsilyl-pyrrole (TMS-pyrrole).

12. The method of claim 1, wherein the removing includes reactive ion etching (RIE).

13. The method of claim 1, wherein the removing includes exposing the patterned substrate to plasma-excited etching gas containing $O_2$ gas and optionally a halogen-containing gas.

14. A method of forming a semiconductor device, the method comprising:
providing a patterned substrate containing a recessed feature formed in a first layer containing a dielectric material and a second layer containing an initial metal layer that is exposed in the recessed feature;
depositing a metal-containing layer on the patterned substrate, including in the recessed feature;
anisotropically removing the metal-containing layer from a bottom of the recessed feature and from a field area around the recessed feature to form the metal-containing layer on sidewalls of the recessed feature;
pre-treating the patterned substrate with a surface modifier that increases metal deposition selectivity on the metal-containing layer on the sidewalls of the recessed feature and on the second layer relative to on the first layer, wherein the pre-treating includes exposing the patterned substrate to a silicon-containing gas;
depositing a ruthenium (Ru) metal layer on the patterned substrate by vapor phase deposition using a gaseous exposure of a Ru-containing precursor, where the Ru metal layer is preferentially deposited on the metal-containing layer on the sidewalls and on the second layer in the recessed feature, relative to on the field area around the recessed feature; and
removing Ru metal nuclei deposited on the field area to selectively form the Ru metal layer in the recessed feature.

15. The method of claim 14, further comprising:
repeating the pre-treating, depositing and removing at least once to increase a thickness of the Ru metal layer in the recessed feature.

16. The method of claim 14, wherein the pre-treating includes forming self-assembled monolayers (SAMs) on the second layer.

17. The method of claim 14, wherein the metal-containing layer contains a metal oxide, a metal nitride, or a combination thereof.

18. The method of claim 17, wherein the metal oxide includes $Al_2O_3$, $TiO_2$, $HfO_2$, or $MnO_2$, and the metal nitride includes AlN, TiN, HfN, or MnN.

19. The method of claim 14, wherein the silicon-containing gas includes an alkyl silane, an alkoxysilane, an alkyl alkoxysilane, an alkyl siloxane, an alkoxysiloxane, an alkyl alkoxysiloxane, an aryl silane, an acyl silane, an aryl siloxane, an acyl siloxane, a silazane, or combination thereof.

20. A method of forming a semiconductor device, the method comprising:
providing a patterned substrate containing a recessed feature formed in a first layer containing a dielectric material and a second layer containing an initial metal layer that is exposed in the recessed feature;
depositing a metal-containing layer on the patterned substrate, including in the recessed feature;
anisotropically removing the metal-containing layer from a bottom of the recessed feature and from a field area around the recessed feature to form the metal-containing layer on sidewalls of the recessed feature;
pre-treating the patterned substrate with a surface modifier that increases metal deposition selectivity on the metal-containing layer on the sidewalls of the recessed feature and on the second layer relative to on the first layer, wherein the pre-treating includes exposing the patterned substrate to a silicon-containing gas;
depositing a ruthenium (Ru) metal layer on the patterned substrate by vapor phase deposition using a gaseous exposure of a Ru-containing precursor, wherein depositing the ruthenium (Ru) metal layer includes exposing the patterned substrate to $Ru_3(CO)_{12}$ and carbon monoxide (CO), and wherein the Ru metal layer is preferentially deposited on the metal-containing layer on the sidewalls and on the second layer in the recessed feature, relative to on the field area around the recessed feature;
removing Ru metal nuclei deposited on the field area to selectively form the Ru metal layer in the recessed feature; and repeating the pre-treating, depositing and removing at least once to increase a thickness of the Ru metal layer in the recessed feature.

* * * * *